United States Patent
Wacker et al.

[19]

[11] Patent Number: 6,133,579

[45] Date of Patent: Oct. 17, 2000

[54] METHOD AND APPARATUS FOR SLANTED ATTITUDE TESTING AND/OR FOR CO-PLANARITY TESTING OF A CONTACT FOR SMD COMPONENTS

[75] Inventors: Josef Wacker, Berg; Hans-Horst Grasmueller, Mammendorf, both of Germany

[73] Assignee: Siemens Aktiengesellschaft, Munich, Germany

[21] Appl. No.: 09/204,410

[22] Filed: Dec. 2, 1998

[30] Foreign Application Priority Data

May 28, 1998 [DE] Germany .............................. 198 23 942

[51] Int. Cl.[7] ....................................................... G06K 9/00

[52] U.S. Cl. ..................... 250/559.34; 29/833; 382/146

[58] Field of Search ............................. 250/559.34, 559.3, 250/559.29, 223 R, 222.1; 356/375, 376, 390, 394, 243.1; 29/833, 740, 759, 721; 382/145, 146, 151

[56] References Cited

U.S. PATENT DOCUMENTS

| 5,502,890 | 4/1996 | Günter . |
| 5,687,475 | 11/1997 | Günter . |
| 6,028,319 | 2/2000 | Tsai ...................................... 250/559.34 |

FOREIGN PATENT DOCUMENTS

WO 93/19577  9/1993  WIPO .

*Primary Examiner*—Seungsook Ham
*Assistant Examiner*—Kevin Pyo
*Attorney, Agent, or Firm*—Hill & Simpson

[57] ABSTRACT

An entire contact row of an SMD component is illuminated by a light source direction in the direction of the contact row, and a shadow of the entire contact row is directed by a linear sensor. A shift of the contact row perpendicular to a contact surface formed by the contact row effects a shift of the position of the shadow on the linear sensor and also effects a modification of the expanse of the shadow. By identifying the minimum expanse of the shadow, a criterion for the co-planarity of the contact row derives from the minimum expanse itself and an indicator about the slanting attitude of the component derives from the position having the minimum expanse.

9 Claims, 3 Drawing Sheets

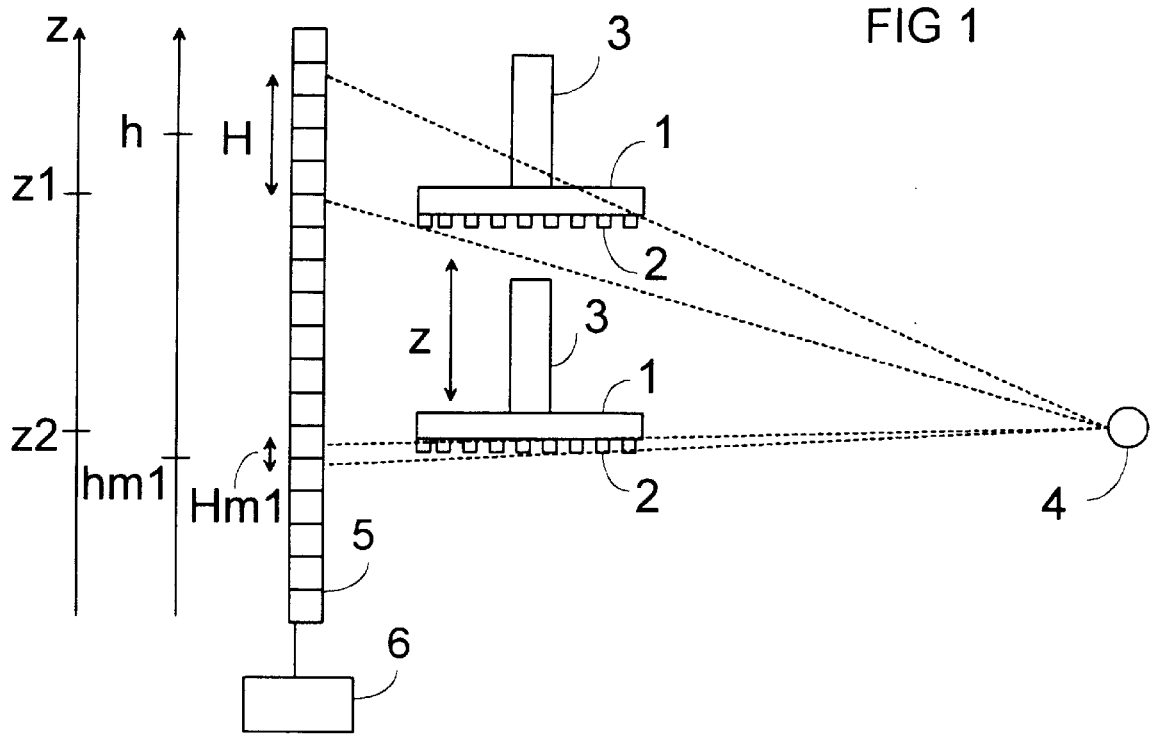
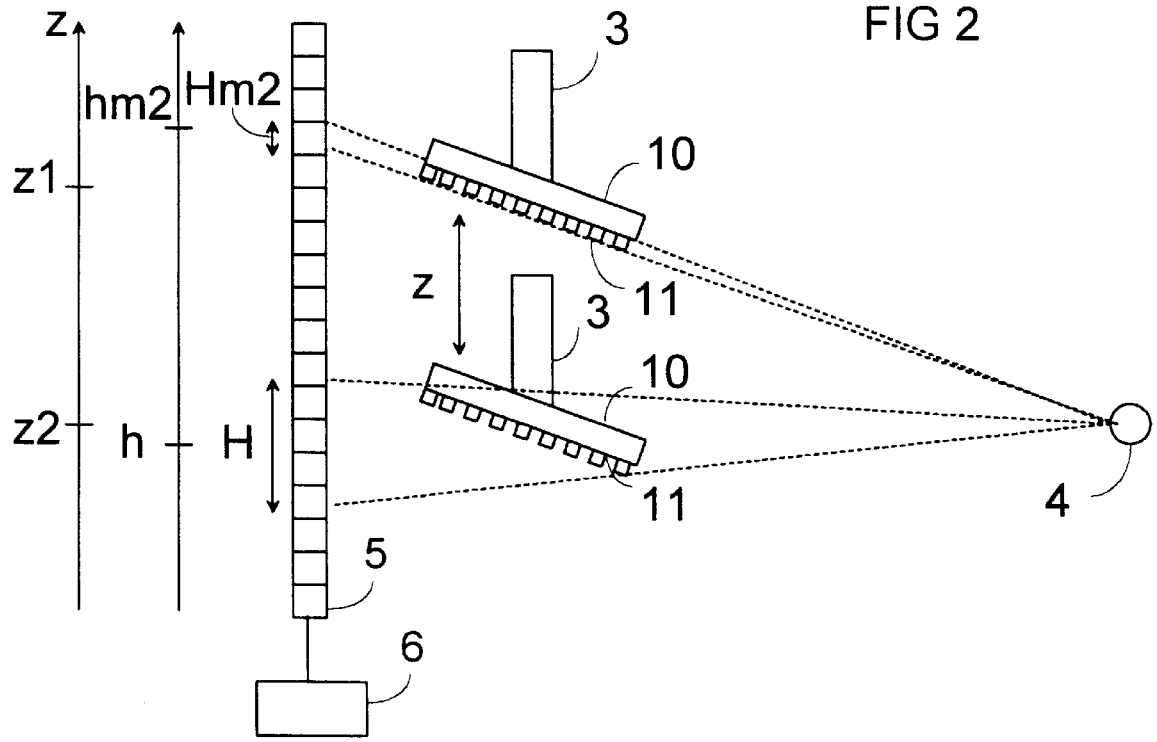

METHOD AND APPARATUS FOR SLANTED ATTITUDE TESTING AND/OR FOR CO-PLANARITY TESTING OF A CONTACT FOR SMD COMPONENTS

BACKGROUND OF THE INVENTION

The present invention is directed to a method and to an apparatus for co-planarity testing and/or for slanted attitude testing of a contact row of SMD components.

In the automatic onserting (equipping or mounting) of printed circuit boards or ceramic substrates with SMD components (SMD=surface mounted device), the individual components are taken from a magazine or a delivery means, e.g., a bulb with an onserting head and are then positioned on the printed circuit board or the ceramic substrate in a predetermined position. Since the components in the magazine or in the fetching position of the delivery means exhibit a positional tolerance of 1 mm, but must be positioned with high precision on the printed circuit board or on the ceramic substrate, an automatic position recognition and correction is required. Further, particularly given SMD components having a great number of terminals, the co-planarity, i.e. the uniform height position of the terminals, must be checked. Such a check is also to be implemented, for example, as a quality control check during the manufacture of SMD components.

WO 93/19577 discloses a shadow-casting method for co-planarity measurement of components. The terminals are individually illuminated by transmitted light and the shadowgram of the terminal end of an SMD component is projected onto a sensor. The optical axis of the imaging has a defined angle unequal to 90° relative to the horizontally arranged object. The height position of the terminal can be calculated from the angle, the spacing of the terminal from the sensor and the position of the shadowgram on the sensor. As a result of different component sizes and different component positions present in the arrangement, blurred imagings of the shadow of the terminals on the sensor arise in this method. Moreover, the position of the shadow on the sensor can shift when the component is farther from the sensor, so that the evaluation of the height position is more difficult. In addition, this method is very time-consuming, particularly given components with a great number of terminals, since every individual terminal must be investigated.

SUMMARY OF THE INVENTION

An object of the invention is to develop a method and an apparatus for co-planarity measurement and/or measuring the slanting attitude of contact rows of components that assure faster identification of the co-planarity and also recognition of a possible slanted attitude of the component at the onserting head.

To that end, in an embodiment, the invention provides a method for testing the co-planarity of a contact row of an SMD component, comprising the steps of:
 transporting the SMD component along a direction of travel whereby the contact row is oriented substantially perpendicular to the direction of travel;
 illuminating the contact row with a light source directed approximately in the direction of the contact row;
 detecting a shadow of the contact row with a sensor which has a linear extension along the direction of travel;
 continuously detecting and storing a position of the contact row along the direction of travel and an expanse of the shadow on the sensor;
 identifying a minimum expanse of the shadow;
 identifying a maximum expanse; and
 determining co-planarity of the contact row from a comparison of the minimum and maximum expanses.

In an embodiment, the invention provides a method for checking the slanting attitude of a contact row of an SMD component, comprising the steps of:
 illuminating the contact row with a light source directed approximately in the direction of the contact row;
 detecting a shadow of the contact row with a sensor which has a linear extension along the direction of travel;
 continuously detecting and storing a position of the contact row along the direction of travel and an expanse of the shadow on the sensor;
 identifying a minimum expanse of the shadow;
 identifying a maximum expanse;
 determining co-planarity of the contact row from a comparison of the minimum and maximum expanses; and
 identifying the position of the minimum expanse of the shadow and a slanting attitude of the contact row.

In an embodiment, the invention provides an apparatus for checking the slanting attitude and/or for co-planarity testing of a contact row of an SMD component, comprising:
 a light source emitting light essentially in the direction of the contact row;
 a conveyor means for moving the contact row in a conveying direction essentially perpendicular to a contact surface formed by the contact row;
 a linear optical sensor positioned opposite the light source and parallel to the conveying direction for detecting the shadow of the contact row; and
 an evaluation means that identifies expanses of shadows projected onto the linear sensor by the light sensor and identifies a minimum expanse and the position of the SMD component at which the minimum expanse occurs.

As a result of the inventive method, it is not individual contacts but entire contact rows that are advantageously simultaneously investigated for co-planarity. A faster co-planarity measurement (when compared to the individual measurement of the contacts) thereby derives. Advantageously, the method can also be employed for measuring a slanting attitude of components at the onserting head. It is not the minimum expanse of the shadow that is measured but the position at which the minimum expanse of the shadow is detected.

In combination of the two methods mentioned above, a simultaneous identification of the slanting attitude as well as of the co-planarity of contact rows of components can be identified.

To that end, in an embodiment, the invention provides that the co-planarity of the contact row is identified from the minimum expanse of the shadow.

In an embodiment of the invention, all contact rows of components are advantageously measured in that the component is turned such at the onserting head that the contact rows are successively measured.

In order to avoid occlusion effects, given a defined movement of the contact row around the position that leads to the minimum expanse of the shadow, the expanses of the shadows resulting therefrom can additionally be identified.

To that end, in an embodiment, the invention provides that following the identification of the expanse and of the position of the minimum shadow, the contact row is conveyed into a position at which the minimum expanse occurs;

the position of the contact row is modified by approximately half the thickness of a contact and the expanse of the shadow is thereby measured and stored; and the co-planarity of the contact row is identified on the basis of the expanses of the shadow thereby measured.

In an embodiment, the invention provides that the optical sensor is planar.

The optical sensor is advantageously planarly fashioned, so that the shadow that then results due to the different positions of the contact rows is detected with a spot light source.

In further embodiments, the invention provides that the light source is made movable approximately perpendicular to the conveying direction and approximately perpendicular to the direction of the contact row and that the light source is made with an expanse approximately perpendicular to the conveying direction and approximately perpendicular to the direction of the contact row.

The light source extends or, respectively, is made movable in a direction perpendicular to the conveying direction and perpendicular to the contact row, so that the differing position of the contact rows is taken into consideration.

These and other features of the invention are discussed in greater detail below in the following detailed description of the presently preferred embodiments with reference to the accompanying drawings.

BRIEF DESCRIPTION OF THE DRAWINGS

FIG. 1 illustrates a schematic side view of the apparatus for determining the co-planarity and for carrying out the check for slanting attitude at a component aligned straight;

FIG. 2 illustrates a schematic side view of the inventive apparatus having a component aligned slanting;

DETAILED DESCRIPTION OF THE PRESENTLY PREFERRED EMBODIMENTS

Figure 3:
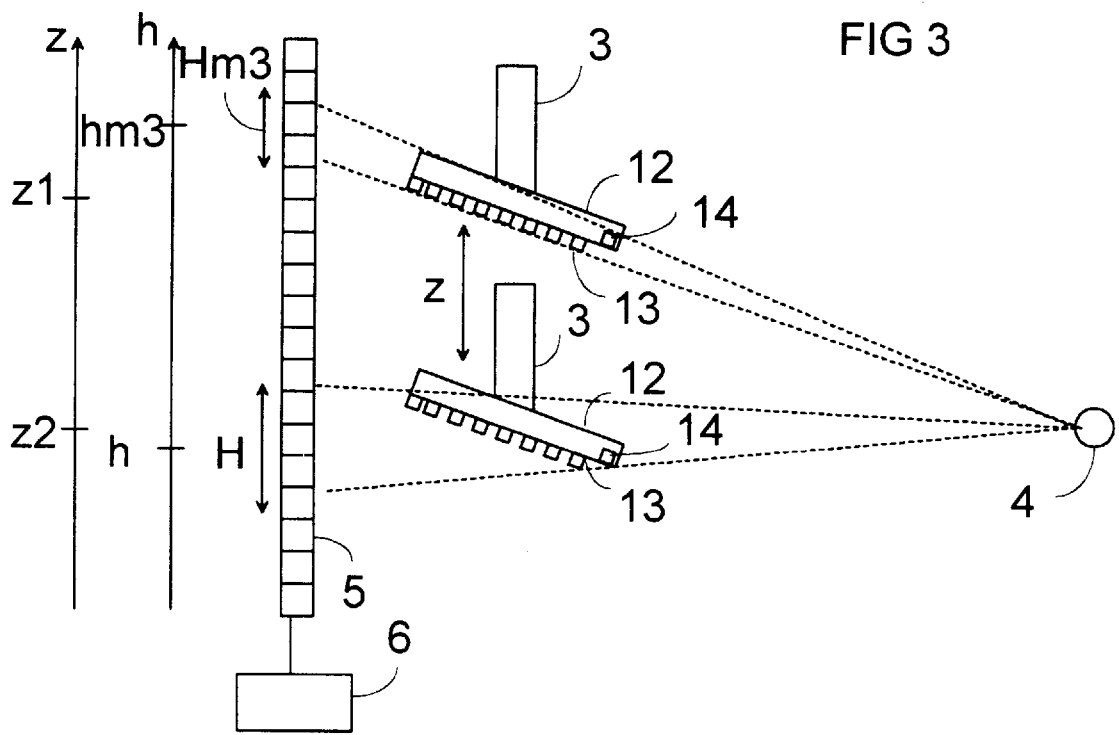
FIG. 3 illustrates a schematic side view of the inventive apparatus having a component with inadequate co-planarity aligned slanting.

FIG. 1 shows how a component 1 aligned straight and having a contact row 2 is secured to a conveyor means 3. The conveyor means 3 can thereby, for example, be a part—fashioned as suction pipette—of an onserting head (not shown) that undertakes the transport of the component 1 from a delivery unit (not shown) to a printed circuit board that is likewise not shown. With the assistance of the conveyor means 3, the component 1 and, thus, the contact row 2, can be moved in a direction perpendicular to the contact surface 7 (see FIG. 4) positioned perpendicular to the contact row. This direction is identified by way of example with an arrow and the reference character z in FIG. 1.

Further, by way of example, a first position z1 and a second position z2 of the conveyor means 3 are shown in FIG. 1. A light source 4 illuminates the contact row 2 essentially in the direction of this contact row 2 (and, hence, essentially perpendicular to the direction of travel z) and thereby generates a shadowgram of the contact row 2 on a line-shaped sensor 5 that is arranged along the conveying direction z (i.e., parallel thereto). This line-shaped sensor 5—for example, an optical sensor is connected to an evaluation means 6. As a result of the different position of the conveyor means 3 and, thus, of the component 1 as well, an expanse H of the shadow of the contact row 2 on the sensor 5 derives at the first position z1.

The shadow is located at a position h. The expanse H of the shadow changes given transport (i.e., movement) of the component 1 and reaches a first minimum expanse Hm1 of the shadow at the second position z2, whereby the shadow with the minimum expanse Hm1 is detected at a first position hm1 of the minimum shadow.

FIG. 2 shows how a component 10 aligned at a slant with an associating contact row 11 is examined in the method. A second minimum expanse Hm2 of the shadow thereby derives, this time at the first position z1 of the conveyor means 3, as does a second position hm2 of the shadow with the minimum expanse hm2. The different slanting attitude of the components 1 and 10 illustrated in FIGS. 1 and 2 can be identified from the difference of the first position hm1 of the minimum shadow in the straight contact row 2 and the second position hm2 of the minimum shadow given the slanting contact row 11.

FIG. 3 shows the method with a component 12 arranged at a slant and having faulty co-planarity due to a bent contact 14 and having a row of straight contacts 13. Due to the same slanting attitude as shown in FIG. 2, the third position hm3 of the shadow with the minimum expanse Hm3 arises at least approximately at the position z1 of the conveyor means 3. The additional, faulty co-planarity due to the bent contact 14 shown in FIG. 3 compared to the slanting attitude shown in FIG. 2 can be identified by the greater expanse Hm3 of the minimum shadow. In this way, the slanting attitude of the components as well as the co-planarity of the contact rows can be simultaneously determined.

Figure 4:
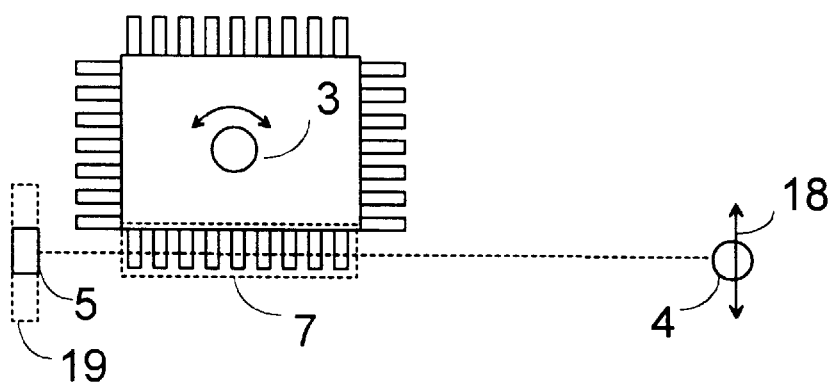
FIG. 4 illustrates a schematic plan view onto an inventive apparatus having a component to be investigated.

It is indicated in FIG. 4 how various contact rows 1 of the components can be examined in an arrangement as a result of a rotation of the component 1 around an axis in conveying direction 3. Given an onserting head with an inventive apparatus, the sensor 5 is to be designed planarly as indicated by block 19 or the light source is to be designed with an expanse 18 perpendicular to the contact row 2 and perpendicular to the conveying direction or moveable in order to take different widths of the components transported at the equipping head into consideration.

Figure 5:
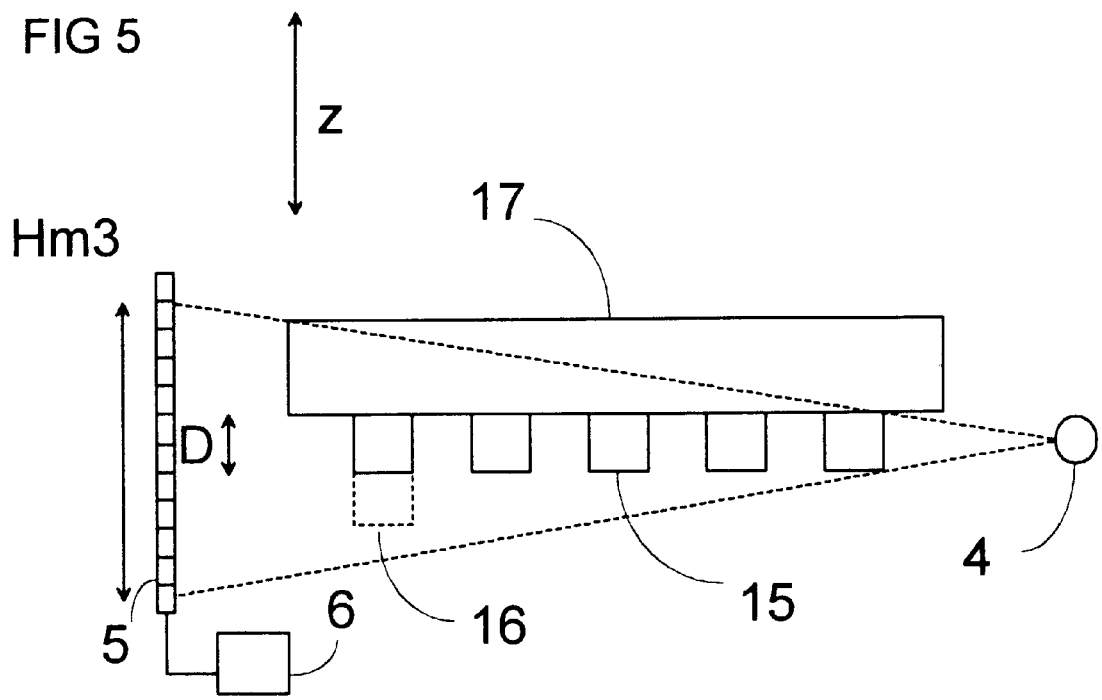
FIG. 5 illustrates a schematic side view of the inventive apparatus having a component with a co-planarity error hidden by an occlusion effect.

FIG. 5 schematically illustrates the inventive method with reference to a straight component 17 having a straight contact row 15 but with a bent contact 16, whereby the bent contact 16 does not influence the minimum expanse Hm3 of the shadow due to an occlusion effect of the contact of the contact row neighboring the light source 4. The deficient co-planarity resulting therefrom can therefore not be identified. Depending upon the distance of the light source 4 and of the sensor 5 from the component 17, an error thereby occurs depending upon the thickness D of the contacts of the contact row 15.

Figure 6:
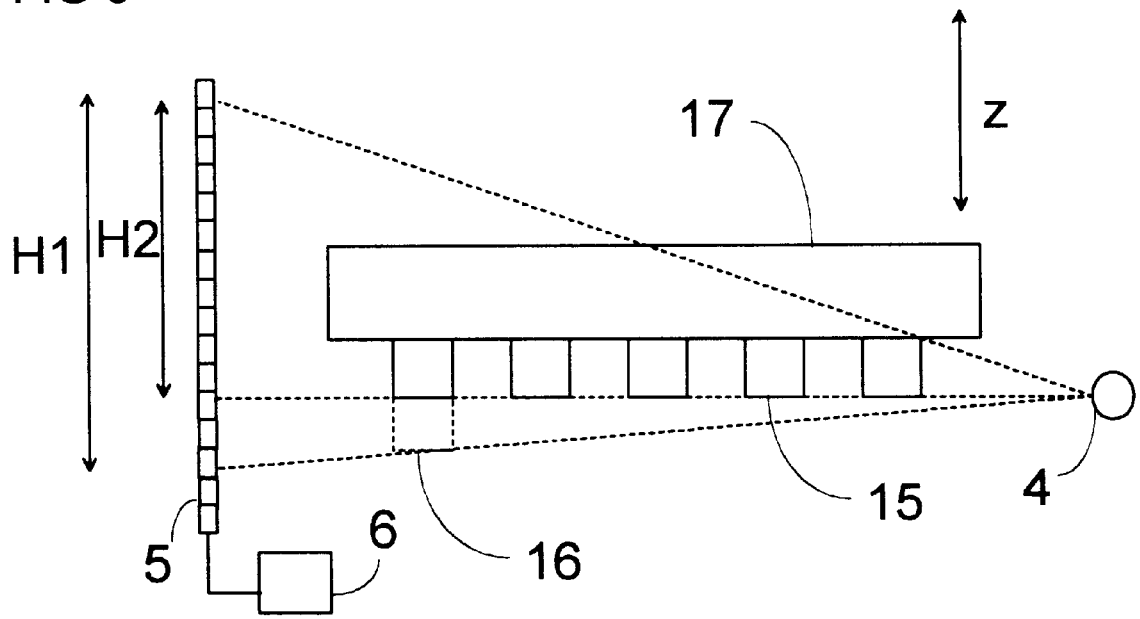
FIG. 6 illustrates a schematic side view with a component according to FIG. 5 that is shifted in conveying direction.

This error is avoided by an additional step in an embodiment of the inventive method. To that end, the component 17 is moved from the position of the minimum expanse of the shadow and is additionally moved in the conveying direction by approximately half the thickness D of the contacts of the contact row 15. As a result thereof, as shown in FIG. 6, different expanses derive. Expanse H1 derives a straight contact row 15 and expanse H2 derives for a contact row with a bent contact 16. These different shadow expanses are detected by the sensor (not shown here). The occlusion effect is avoided in this way.

The inventive method therefore represents an effective method for quickly identifying the slanting attitude and the co-planarity of contact rows of SMD components. Given utilization of the apparatus with an onserting head, the planar sensor 19 is utilized instead of the line sensor 5, since, due to the different dimensions of components, the shadows are no longer imaged at a permanently defined position at which the optical line sensor 5 was arranged.

It can also be appreciated that the evaluation unit can also take into consideration predetermined expected shadow expanses to determine if bent contacts occur in the middle of a contact row. Thus, for example, with reference to FIG. 2, the evaluation unit would look for the expanse Hm2 at the position hm2. Any deviation from an expected minimum shadow expanse would indicate the presence of a bent contact.

Although modifications and changes may be suggested by those skilled in the art, it is the intention of the inventors to embody within the patent warranted hereon all changes and modifications as reasonably and properly come within the scope of their contribution to the art.

What is claimed is:

1. A method for testing the co-planarity of contacts along a contact row of an SMD component, comprising the steps of:

transporting the SMD component along a direction of travel whereby the contact row is oriented substantially perpendicular to the direction of travel;

illuminating the contact row with a light source directed approximately in the direction of the contact row;

detecting a shadow of the contact row with a sensor which has a linear extension along the direction of travel;

continuously detecting and storing a position of the contact row along the direction of travel and an expanse of the shadow on the sensor;

identifying a minimum expanse of the shadow;

identifying a maximum expanse; and determining co-planarity of the contact row from a comparison of the minimum and maximum expanses.

2. A method for checking the slanting attitude of a contact row of an SMD component, comprising the steps of:

illuminating the contact row with a light source directed approximately in the direction of the contact row;

detecting a shadow of the contact row with a sensor which has a linear extension along the direction of travel;

continuously detecting and storing a position of the contact row along the direction of travel and an expanse of the shadow on the sensor;

identifying a minimum expanse of the shadow;

identifying a maximum expanse;

determining co-planarity of the contact row from a comparison of the minimum and maximum expanses; and identifying the position of the minimum expanse of the shadow and a slanting attitude of the contact row.

3. The method of claim 2, wherein the co-planarity of the contact row is identified from the minimum expanse of the shadow.

4. The method according to one of the claims 1–3, wherein different contact rows are checked for their respective slanting attitude and co-planarity by turning SMD components around an axis parallel to the conveying direction.

5. The method according to any of claims 2–4, wherein, following the identification of the expanse and of the position of the minimum shadow, the contact row is conveyed into a position at which the minimum expanse occurs;

the position of the contact row is modified by approximately half the thickness of a contact and the expanse of the shadow is thereby measured and stored; and the co-planarity of the contact row is identified on the basis of the expanses of the shadow thereby measured.

6. An apparatus for checking the slanting attitude and/or for co-planarity testing of a contact row of an SMD component, comprising:

a light source emitting light essentially in the direction of the contact row;

a conveyor means for moving the contact row in a conveying direction essentially perpendicular to a contact surface formed by the contact row;

a linear optical sensor positioned opposite the light source and parallel to the conveying direction for detecting the shadow of the contact row; and an evaluation means that identifies expanses of shadows projected onto the linear sensor by the light source and identifies a minimum expanse and the position of the SMD component at which the minimum expanse occurs.

7. The apparatus of claim 6, wherein the optical sensor is planar.

8. The apparatus of one of claims 6 or 7, wherein the light source is made movable approximately perpendicular to the conveying direction and approximately perpendicular to the direction of the contact row.

9. The apparatus of claim 6 or 7, wherein the light source is made with a linear expanse approximately perpendicular to the conveying direction and approximately perpendicular to the direction of the contact row.

* * * * *